United States Patent
Hayashi et al.

[11] Patent Number: 6,020,772
[45] Date of Patent: Feb. 1, 2000

[54] FLASH OUTPUT LSSD LATCH

[75] Inventors: Masa Hayashi, Sunny Vale, Calif.;
Richard F. Keil, Jonesville, Vt.

[73] Assignee: International Business Machines Corporation, Armonk, N.Y.

[21] Appl. No.: 09/019,356

[22] Filed: Feb. 5, 1998

[51] Int. Cl.[7] ................................................ H03K 3/356
[52] U.S. Cl. ........................................ 327/202; 327/203
[58] Field of Search .................................. 327/202, 203, 327/208–213, 218

[56] References Cited

U.S. PATENT DOCUMENTS

| | | | |
|---|---|---|---|
| 4,939,384 | 7/1990 | Shikata et al. | 327/212 |
| 5,032,783 | 7/1991 | Hwang et al. | 324/73.1 |
| 5,059,828 | 10/1991 | Tanagawa | 326/40 |
| 5,539,336 | 7/1996 | Nguyen et al. | 326/83 |
| 5,598,120 | 1/1997 | Yurash | 327/202 |
| 5,610,927 | 3/1997 | Segars | 371/223 |
| 5,633,606 | 5/1997 | Gaudet et al. | 327/202 |
| 5,656,962 | 8/1997 | Banik | 327/202 |
| 5,668,490 | 9/1997 | Mitra et al. | 327/203 |
| 5,706,627 | 1/1998 | Gregor et al. | 327/215 |
| 5,767,716 | 6/1998 | Ko | 327/208 |

*Primary Examiner*—Tuan T. Lam
*Attorney, Agent, or Firm*—Whitham, Curtis & Whitham; Robert A. Walsh

[57] ABSTRACT

A two stage latch or shift register latch with very reduced propagation delay in the second stage, that may be used for LSSD type integrated circuits. The two stage register includes a first stage receiving and latching data. The first stage may also include a scan input for scanning in test data. The data is passed to a second stage which provides the received data as an output and latches the output. The preferred second stage includes a pair of cross coupled inverters, and a complementary clock stage. The complementary clock stage selectively passes the received data from the first stage to the output and, then, the second latch latches the output.

11 Claims, 3 Drawing Sheets

FLASH OUTPUT LSSD LATCH

BACKGROUND OF THE INVENTION

1. Field of the Invention

The present invention is related to Integrated Circuits and, more particularly, to shift register latches used in integrated circuits.

2. Background Description

Integrated Circuit (IC) chip performance is determined by its critical path, i.e., the logic path with the longest propagation delay. Level sensitive scan design (LSSD) and other synchronous architectures have shift register latches at various stages in chip logic paths to shorten the critical paths, allowing the chips to operate at higher clock speeds.

FIG. 1 is a schematic of a prior art LSSD latch 50, which is, typically, a two stage latch that includes a first stage, called the "L1" stage or latch and a second stage called the "L2" stage or latch. The L1 stage includes a first latch 52 and a pair of input clock stages 54, 56, that, preferably, are identical. The first stage also includes input buffers 58, 60 buffering input data signals D0, I0, respectively. The output of the L1 latch 52 is buffered by inverter 62 for stability. The L2 stage includes a clock stage 64, a latch 66 and an output buffer 68 in parallel with the L2 latch 66.

Normally, data is received by and clocked into the L1 latch 52, passed from the L1 latch 52 to the L2 latch 66 and clocked out of the L2 latch 66. The LSSD latch stage delay includes the L1 latch 52 setup time, L1 latch 52 settling time, the L2 latch 66 setup time and the propagation delay through the L2 latch 66, i.e., the delay between asserting the L2 latch clock (B)) and having valid data at the output 68 of the L2 buffer. These LSSD latch delays may be equivalent to the delay of multiple logic stages. Consequently, the shorter the logic path between LSSD stages, the more dominant the latch stage delay itself becomes.

Thus, there is a need for reducing LSSD latch propagation delays.

SUMMARY OF THE INVENTION

It is a purpose of the invention to improve LSSD chip performance.

It is another purpose of the present invention to reduce LSSD stage delays.

It is yet another purpose of the present invention to reduce LSSD latch propagation delays.

The present invention is a two stage latch or register that may be used for LSSD type integrated circuits and has very little propagation delay in its second stage. The preferred embodiment includes a first stage latch receiving data; a second stage providing the received data as an output and, then, latching the output. The preferred second stage includes a pair of cross coupled inverters, and a complementary clock stage selectively passing received data to the output, which is also connected to the output of the second stage latch.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
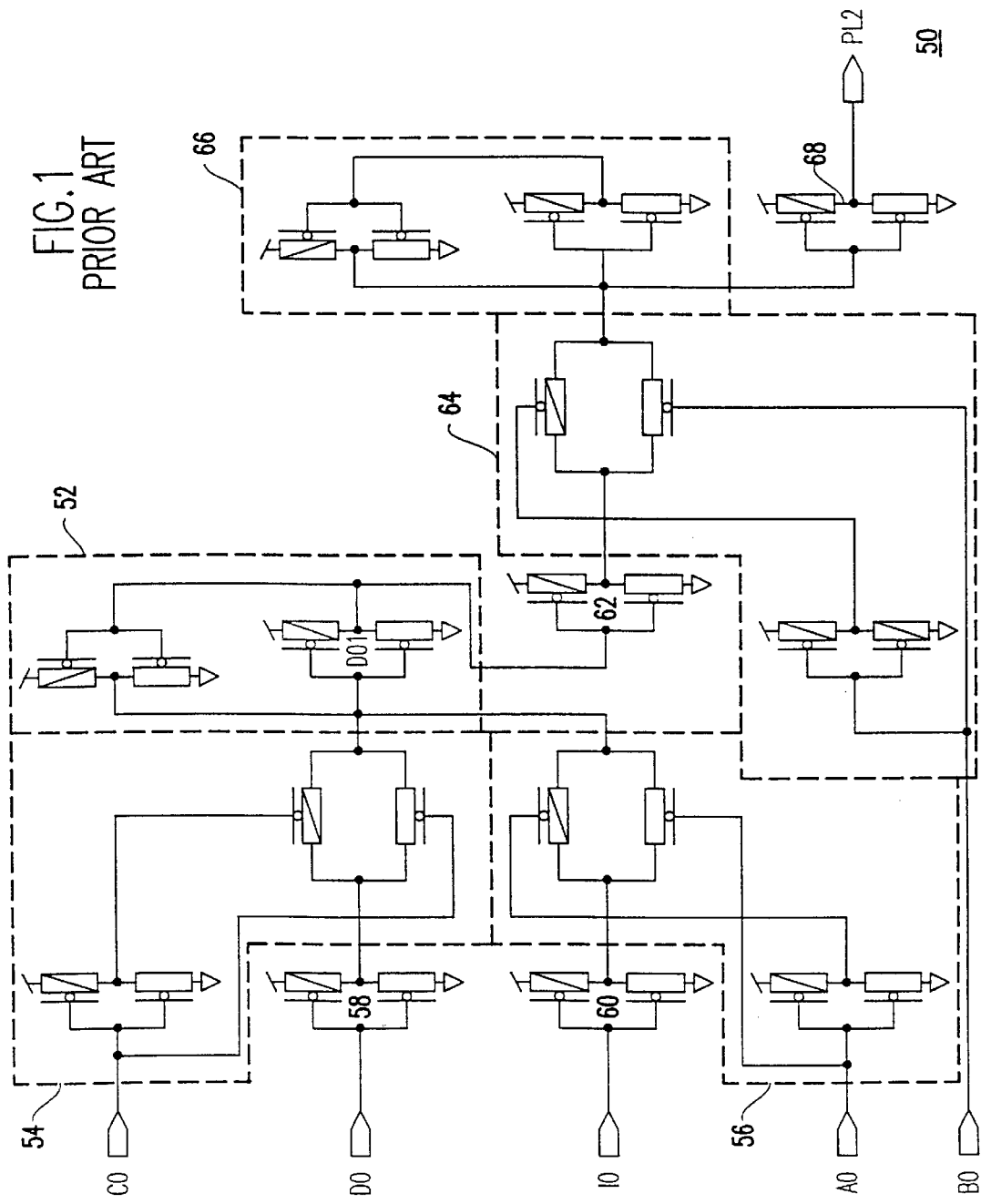
FIG. 1 is a schematic of a prior art LSSD latch.
Figure 2:
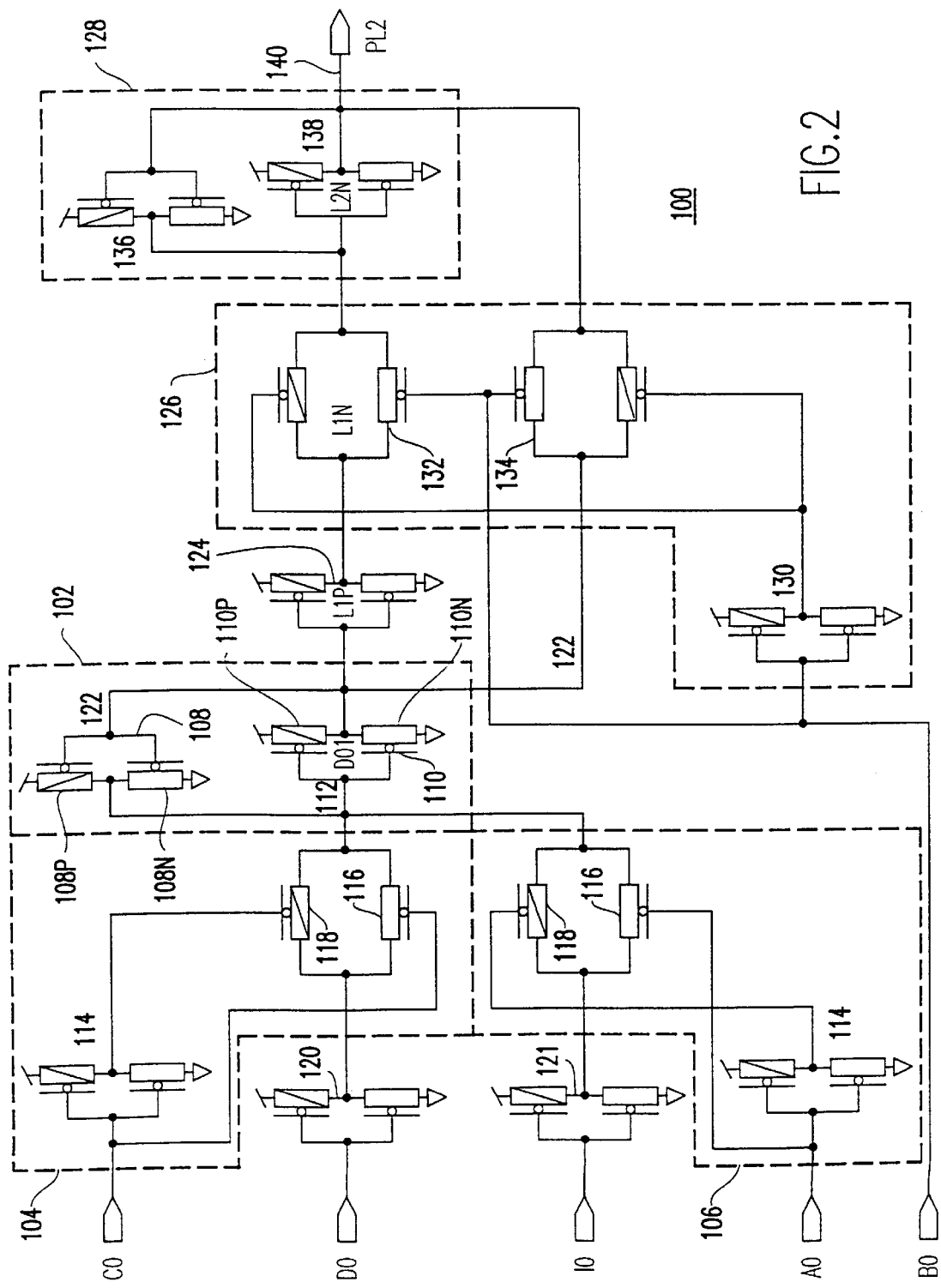
FIG. 2 is a schematic of a preferred embodiment two stage latch.

Referring now to the drawings, and more particularly to FIG. 2, which is a schematic of a preferred embodiment two stage or shift register latch 100 that may be used for LSSD applications. The first stage is non-inverting and after data is latched in the first or L1 stage, it is passed directly to the two stage latch output, which is also the output of the second or L2 stage. Thus, data is passed directly out of the two stage latch 100 as it is clocked into the second stage. Coincident with being passed out of the latch 100, the data is latched into the second stage.

The first stage includes a first latch 102 and a pair of input clock stages 104, 106, that, preferably, are identical. The first latch is a pair of cross coupled inverters 108, 110. Each of the inverters 108 and 110 is what is commonly referred to as a CMOS invertor. Each CMOS invertor 108, 110 includes one N-type field effect transistor (NFET) 108N, 110N and one P-type FET (PFET) 108P, 110P.

The input clock stages 104, 106, each include a CMOS inverter 114 and a CMOS pass gate, which is a pair of FETs 116, 118. The clock input A0 or C0 to each CMOS inverter 114 is connected to the gate of one FET 116 of the CMOS pass gate and the inverter's output is connected to the gate of the other FET 118. Preferably, although not required, the first stage also includes input buffers 120, 121, which are CMOS inverters, that buffer data signals D0, I0. Data D0 or I0 is inverted in data input buffer 120 or 121 and, then, the inverted data is provided to a data input side of the pair of FETs 116, 118 in clock stage 104 or 106, respectively. The inverted data passes through the pair of FETs 116, 118 in clock stage 104 or 106 to an input 112 of the first latch 102.

Inverted data from input clock stages 104, 106 is latched in the first latch. The non-inverting output 122 of first latch 102 is the input of a CMOS buffer, inverter 124. CMOS buffer 124 inverts the output of first latch 102. Non-inverting output 122 and the output of buffer 124 are the inputs to the second stage.

The second stage of the preferred embodiment latch 100 includes a complementary clock stage 126 and a second latch 128. The complementary clock stage 126 includes CMOS clock inverter 130 and a pair of CMOS pass gates 132, 134. The clock input inverter 130 is a CMOS inverter connected between same type FETs of CMOS pass gates 132, 134. Clock input B0 is connected to the input of inverter 130 and to the gate of one type FET (NFET) of each CMOS pass gate 132, 134. The output of clock input inverter 130 is connected to the other type of FET (PFET) of each CMOS pass gate 132, 134.

Data from the first latch output 122 is connected to a first side of CMOS pass gate 134. Inverted data from the output of inverter 124 is connected to a first side of CMOS pass gate 132. The other side of both CMOS pass gates 132, 134 are the complementary outputs of complementary clock stage 126.

The second latch 128 is a pair of cross coupled inverters 136, 138 that is connected between the complementary outputs of complementary clock stage 126. Unlike prior art shift register latches, when data is clocked into the second stage of the preferred embodiment two stage latch 100 by driving B0 high, data passes directly to output 140 from the first latch output 122. As data passes out on output 140, the second latch 128 sets.

Typically, for LSSD applications, one data input I0 is a scan input for providing test data to the first stage when scan clock A0 is high. Using two stage latches for LSSD type test operations is well known in the art and is not discussed herein.

Figure 3:
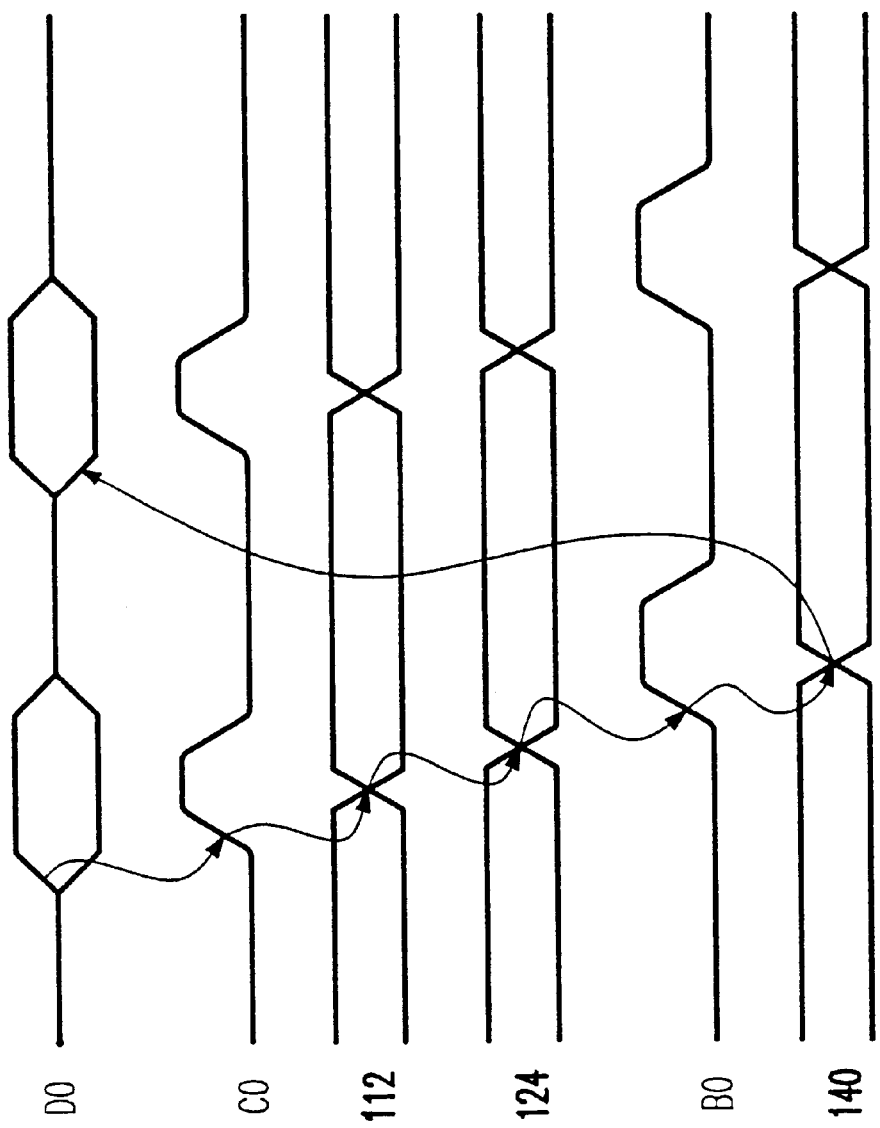
FIG. 3 is a timing diagram for the preferred embodiment latch of FIG. 1.

However, normal functional operation of the preferred embodiment latch 100 may be better understood with reference to the timing diagram of FIG. 3. The first stage of the preferred embodiment two stage latch 100 is loaded from D0 by driving clock C0 high once D0 is stable. Driving C0 high opens the pass gate in clock stage 104. The data input D0 is inverted by input buffer 120 and the inverted input is passed through the clock stage 104 to the input side 112 of first latch 102, which latches the data. As soon as the data is latched, it is available at first latch output 122.

After the first latch 102 is set, the input clock C0 may be dropped closing clock stage 104. Once data is available at the first latch output 122, B0 may be raised, to pass data from the first latch 102 directly to output 140 through pass gate 134. Typically, clock input B0 may be raised coincident with dropping C0 or at any time thereafter.

As noted above, depending on the rise of B0, as data passes through complementary clock stage 126, it may be being inverted by CMOS buffer inverter 124. This inverted data is passed from buffer 124 through CMOS pass gate 136 to second latch 128. When B0 falls, second latch 128 maintains the data and output 140 stable until it is changed, i.e., when new data is properly clocked into two stage latch 100.

Thus the latch of the present invention is faster than prior art shift register latches because it avoids the serial delays incurred in latching data before it is passed to the next logic stage.

While the invention has been described in terms of preferred embodiments, those skilled in the art will recognize that the invention can be practiced with modification within the spirit and scope of the appended claims.

We claim:

1. A two stage latch comprising:
   a first stage receiving a first clock and a second clock, and receiving data and storing said received data;
   a second stage receiving said stored data from said first stage, said second stage further providing said stored data as an output, said second stage comprising:
   a pair of cross coupled inverters, and
   a complimentary clock stage comprising first and second field effect transistor (FET) pass gates that receive a third clock, said first FET pass gate having at least one gate connected to at least one gate of said second FET pass gate, wherein said complementary clock stage selectively passes said stored data to said output, said cross coupled inverters latching said output received from said complementary clock stage.

2. The two stage latch of claim 1 wherein said FET pass gates are CMOS pass gates, the gates of a first type FET of said CMOS pass gates are connected to receive said third clock, and the gates of a second type FET of said CMOS pass gates are connected together, said second stage further comprising:
   an inverter connected to receive said third clock, and said inverter's output being connected to said gates of said second type FET.

3. A shift register latch comprising:
   a first stage comprising:
   a first latch,
   means for selectively providing a first data input to said first latch in response to a first clock,
   means for selectively providing a second data input to said first latch in response to a second clock, and
   an inverter, the inverter's input connected to a non-inverting output of said first latch;
   a second stage comprising:
   a second latch, and
   means for selectively coupling said non-inverting output to a shift register latch output in response to a third clock, said second latch latching said shift register latch output.

4. The shift register latch of claim 3 wherein said first latch and said second latch each comprise a pair of cross coupled inverters.

5. The shift register latch of claim 4 wherein said means for selectively providing said first data input and said means for selectively providing said second data input are pass gates.

6. The shift register latch of claim 5 wherein said means for selectively coupling said non-inverting output is a complementary clock stage.

7. The shift register latch of claim 6 wherein said shift register latch is a CMOS shift register latch, and said means for selectively providing said first and second data inputs to said first latch are CMOS pass gates.

8. The shift register latch of claim 8 wherein said complementary clock stage is a pair of CMOS pass gates and an inverter, said pair of CMOS pass gates having same type FET gates connected together and said inverter being connected between opposite type FET gates.

9. A two stage latch comprising:
   A two stage latch comprising:
   a first stage receiving a first clock and a second clock, and receiving data and storing said received data;
   a second stage receiving a third clock offset in time with respect to said first and second clocks and said stored data from said first stage, said second stage further providing said stored data as an output, said second stage comprising:
   a pair of cross coupled inverters, and
   a complimentary clock stage comprising a clock inverter and a first pass gate and a second pass gate, wherein an output from said clock inverter is provided to each of said first and second pass gates, and an output of said first pass gate is provided as an input to each of said cross coupled inverters, wherein said complementary clock stage selectively passes said stored data to said output, and said cross coupled inverters latch said output received from said complimentary clock stage.

10. A two stage latch comprising:
    a first stage receiving a first clock and a second clock, said first stage receiving data and storing said received data;
    a second stage receiving a third clock and said stored data from said first stage, said second stage further providing said stored data as an output, said second stage comprising:
    a pair of cross coupled inverters, and
    a complimentary clock stage selectively passing said stored data to said output, said cross coupled inverters latching said output received from said complementary clock stage, wherein said complementary clock stage further includes first and second field effect transistor (FET) CMOS pass gates, said first FET CMOS pass gate having at least one gate connected to at least one gate of said second FET CMOS pass gate, wherein the gates of a first type FET of said CMOS pass gates are connected to receive said third clock, and the gates of a second type FET of said CMOS pass gates are connected together; and an inverter connected to receive said third clock and said inverter's output being connected to said gates of said second type FET.

11. The two stage latch of claim 9, wherein said second pass gate passes said stored data to said output, said cross coupled inverters latching said output.

* * * * *